(12) United States Patent
Kondo et al.

(10) Patent No.: US 9,048,267 B2
(45) Date of Patent: Jun. 2, 2015

(54) SEMICONDUCTOR DEVICE

(71) Applicant: KABUSHIKI KAISHA TOSHIBA, Minato-Ku, Tokyo (JP)

(72) Inventors: Yoshiyuki Kondo, Yokohama (JP); Masakazu Goto, Yokohama (JP); Shigeru Kawanaka, Yokohama (JP); Toshitaka Miyata, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/145,141

(22) Filed: Dec. 31, 2013

(65) Prior Publication Data

US 2015/0076553 A1     Mar. 19, 2015

(30) Foreign Application Priority Data

Sep. 13, 2013   (JP) .................................. 2013-190889

(51) Int. Cl.
*H01L 29/66* (2006.01)
*H01L 29/78* (2006.01)

(52) U.S. Cl.
CPC ...... *H01L 29/66977* (2013.01); *H01L 29/7833* (2013.01); *H01L 29/66659* (2013.01)

(58) Field of Classification Search
CPC ... H01L 29/78; H01L 29/0665; H01L 29/513; H01L 21/28273; H01L 21/28282; H01L 21/26586; H01L 27/1203; H01L 29/42312; H01L 29/78696; H01L 29/0843; H01L 29/66477; H01L 21/3083; H01L 27/092

See application file for complete search history.

(56) References Cited

U.S. PATENT DOCUMENTS

| | | |
|---|---|---|
| 2012/0228706 A1 | 9/2012 | Sugizaki et al. |
| 2013/0075830 A1 | 3/2013 | Miyano et al. |
| 2013/0134504 A1* | 5/2013 | Kondo et al. ................. 257/330 |
| 2014/0035040 A1* | 2/2014 | Le Royer et al. ............. 257/365 |

OTHER PUBLICATIONS

Jean-Pierre Colinge et al, "Nanowire Transistors without junctions", Nature Nanotechnology, vol. 5, Mar. 2010, pp. 225-229 (in English).

B. Ghosh et al., "Junctionless Tunnel Field Effect Transistor", IEEE Electron Device Letters, vol. 34, No. 5, May 2013, pp. 5874-586 (in English).

B. Ghosh et al., "Junctionless Tunnel Field Effect Transistor", IEEE Electron Device Letters, vol. 34, No. 5, May 2013, pp. 584-586 (in English).

* cited by examiner

*Primary Examiner* — Roy Potter
*Assistant Examiner* — Paul Patton
(74) *Attorney, Agent, or Firm* — Holtz, Holtz, Goodman & Chick PC

(57) ABSTRACT

A semiconductor device according to the present embodiment includes a semiconductor layer. A gate dielectric film is provided on a surface of the semiconductor layer. A gate electrode is provided on the semiconductor layer via the gate dielectric film. A drain layer of a first conductivity type is provided in a part of the semiconductor layer on a side of a first end of the gate electrode. A source layer of a second conductivity type is provided in a part of the semiconductor layer on a side of a second end of the gate electrode and below the gate electrode. The source layer has a substantially uniform impurity concentration at the part of the semiconductor layer below the gate electrode. Voltages of a same polarity are applied to the gate electrode and the drain layer.

20 Claims, 12 Drawing Sheets

FIG.5A
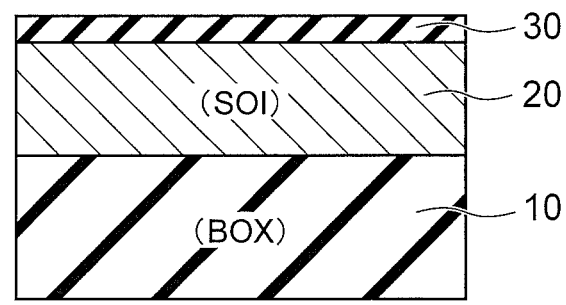
FIG.5B
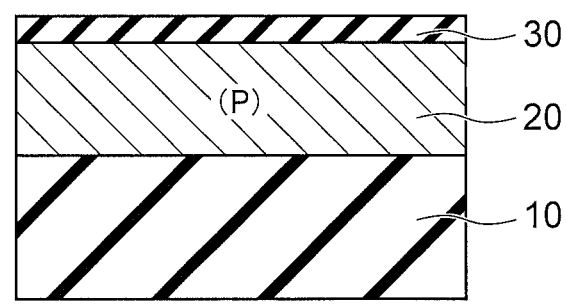

SEMICONDUCTOR DEVICE

CROSS REFERENCE TO RELATED APPLICATIONS

This application is based upon and claims the benefit of priority from the prior Japanese Patent Application No. 2013-190889, filed on Sep. 13, 2013, the entire contents of which are incorporated herein by reference.

FIELD

The embodiments of the present invention relate to a semiconductor device.

BACKGROUND

In recent years, a TFET (Tunnel Field-Effect Transistor) using a quantum mechanical effect of electrons has been developed. In the TFET, BTBT (Band To Band Tunneling) is caused between a source and a channel by applying a voltage to a gate electrode. This brings the TFET into an on-state.

In the TFET, it is considered to set the impurity concentration profile of a source layer to be abrupt in order to obtain steep sub-threshold characteristics. In order to set the impurity concentration profile to be abrupt, ion implantation for forming the source layer needs to be performed shallowly and in a high dose amount. It is known that the impurity concentration profile of a diffusion layer formed shallow and in a high concentration generally varies greatly in a wafer plane due to subsequent heat treatment or the like. Variations in the impurity concentration profile lead to variations in electrical characteristics (a threshold voltage, for example) of the TFET. For example, when variations in the threshold voltage are large, a power supply voltage for a circuit cannot be lowered in consideration of inclusion of a TFET with a high threshold voltage in the circuit. Therefore, a low-power circuit to which the power supply voltage is kept low is difficult to configure with the conventional TFETs.

BRIEF DESCRIPTION OF THE DRAWINGS

FIGS. 5A to 8 are cross-sectional views showing an example of a manufacturing method of the TFET 100 according to the first embodiment;

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor layer on which semiconductor elements are provided is assumed as "an upper direction". Therefore, the term "upper direction" or "lower direction" occasionally differs from an upper direction or a lower direction based on a gravitational acceleration direction.

A semiconductor device according to the present embodiment includes a semiconductor layer. A gate dielectric film is provided on a surface of the semiconductor layer. A gate electrode is provided on the semiconductor layer via the gate dielectric film. A drain layer of a first conductivity type is provided in a part of the semiconductor layer on a side of a first end of the gate electrode. A source layer of a second conductivity type is provided in a part of the semiconductor layer on a side of a second end of the gate electrode and below the gate electrode. The source layer has a substantially uniform impurity concentration at the part of the semiconductor layer below the gate electrode. Voltages of a same polarity are applied to the gate electrode and the drain layer.

First Embodiment

Figure 1:
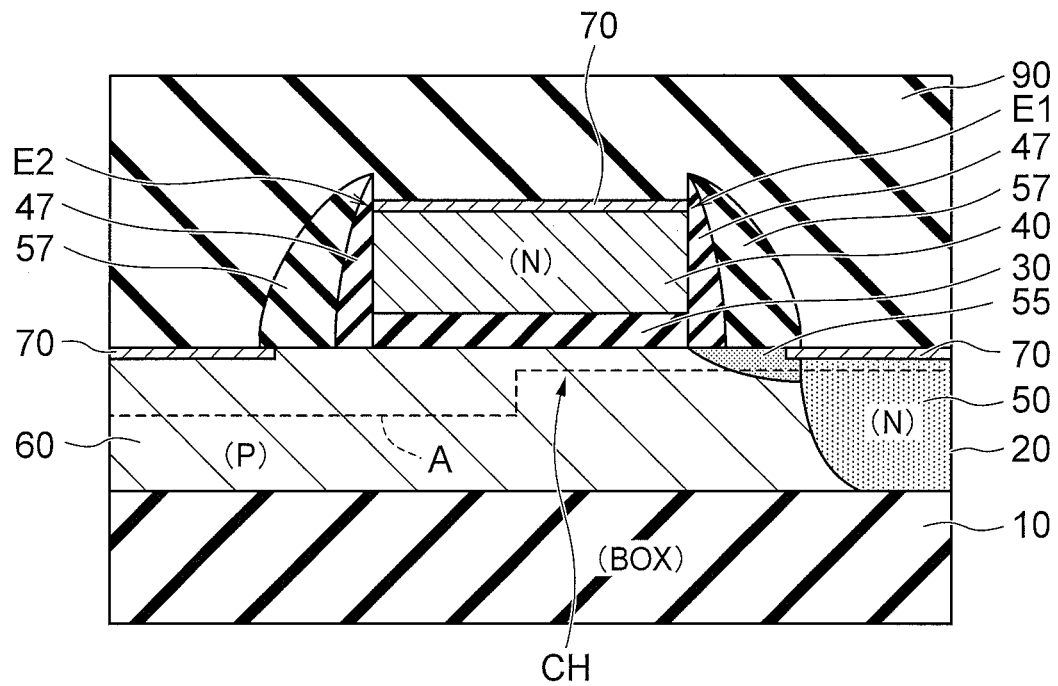
FIG. 1 is a cross-sectional view showing an example of a configuration of a TFET 100 according to a first embodiment.

FIG. 1 is a cross-sectional view showing an example of a configuration of a TFET 100 according to a first embodiment. The TFET 100 can be used for a logic semiconductor integrated circuit such as a microprocessor or an ASIC (Application Specific Integrated Circuit).

The TFET 100 includes a BOX (Buried Oxide) layer 10, a semiconductor layer 20, a gate dielectric film 30, a gate electrode 40, an n-drain layer 50, an n-extension layer 55, a p-source layer 60, a silicide layer 70, a spacer 47, a side wall film 57, and an interlayer dielectric film 90.

The semiconductor layer 20 is an SOI (Silicon On Insulator) layer provided on the BOX layer 10. The gate dielectric film 30 is an insulating film provided on the surface of the semiconductor layer 20 and is formed using, for example, a silicon dioxide film or a dielectric material having a higher relative permittivity than that of the silicon dioxide film.

The gate electrode 40 is provided on the semiconductor layer 20 via the gate dielectric film 30 interposed therebetween. The gate electrode 40 is formed using, for example, a conductive material such as n-doped polysilicon.

The n-drain layer 50 is provided in a part of the semiconductor layer 20 located on the side of an end (a first end) E1 of the gate electrode 40. The n-extension layer 55 is provided to extend from the drain layer 50 to a part of the semiconductor layer 20 below the gate electrode 40, on the surface-side of the semiconductor layer 20. If the deep drain layer 50 extends to the end E1 of the gate electrode 40 without the extension layer 55, a GIDL (Gate Induced Drain Leakage) current may occur during standby (off-time) and sub-threshold swing characteristics (hereinafter, also "SS characteristics") may degrade. To suppress degradation in the SS characteristics, the extension layer 55 that is shallow and has a lower impurity concentration is formed.

The p-source layer 60 is provided in a part of the semiconductor layer 20 located on the side of the other end (a second end) E2 of the gate electrode 40 and on a lower side of the gate electrode 40. In the first embodiment, most parts of the bottom surface of the gate electrode 40 face the source layer 60. That is, in the semiconductor layer 20, the source layer 60 is provided to extend from the other end E2 of the gate electrode 40 through under the bottom surface of the gate electrode 40 to near the end E1 of the gate electrode 40. Therefore, a channel portion CH below the gate electrode 40 has the same conductive type as that of the source layer 60. And, the channel portion CH has an impurity concentration substantially equal to that of the source layer 60. That is, there is no pn-junction between the source layer 60 and the channel portion CH, and a concentration gradient therebetween is low. The source layer 60 and the channel portion CH extend at substantially uniform impurity concentrations. Accordingly, the channel portion CH is defined as a facing region to the bottom surface of the gate electrode 40 and to the source layer 60.

The silicide layer 70 is provided on the gate electrode 40, the drain layer 50, and the source layer 60. For example, the silicide layer 70 is a metal silicide obtained by reacting metal such as Ni, Co, or Ti with silicon.

The spacer 47 and the side wall film 57 are provided on side surfaces of the gate electrode 40. The spacer 47 and the side wall film 57 are composed of, for example, an insulating film such as a TEOS (Tetraethyl orthosilicate) film or a silicon nitride film ($Si_3N_4$).

The interlayer dielectric film 90 covers the gate electrode 40, the drain layer 50, the source layer 60, and the like. The interlayer dielectric film 90 is formed by, for example, an insulting film such as a TEOS film or a silicon dioxide film. Although not shown, an interconnection structure including contacts, metal interconnections, interlayer dielectric films, and the like is further provided in the interlayer dielectric film 90 or on the interlayer dielectric film 90.

In the first embodiment, the source layer 60 is adjacent to the drain layer 50 (the extension layer 55) in a region on the side of the end E1 of the gate electrode 40 (near the end E1). No intrinsic layer (hereinafter, also "i layer") is provided between the source layer 60 and the drain layer 50 (the extension layer 55). In this case, the intrinsic layer is an intrinsic semiconductor layer not containing impurities (a semiconductor layer of an impurity concentration equal to or lower than $10^{16}/cm^3$).

A semiconductor integrated circuit using general MISFETs (Metal Insulator Semiconductor FETs) enables reduction in the power supply voltage by downscaling elements. In the general MISFET, however, the gate electrode is narrowed (short-channeled) due to the downscaling. Associated therewith, degradation in the SS characteristics and short-channel effects such as DIBL (Drain Induced Barrier Lowering) occur. Therefore, thinning of the gate dielectric film and increasing in the impurity concentration of the channel are required. In this case, however, increase in a gate leakage current or the GIDL current causes a problem. Therefore, it is difficult to further downscale the general MISFET.

On the other hand, the TFET 100 according to the first embodiment is controlled to be on/off using a tunneling effect of electrons, while voltages to be applied to the gate electrode 40, the source layer 60, and the drain layer 50 are almost equal to those in the MISFET. This can achieve steep SS characteristics. An operation of the TFET 100 according to the first embodiment is further explained below.

Figure 2:
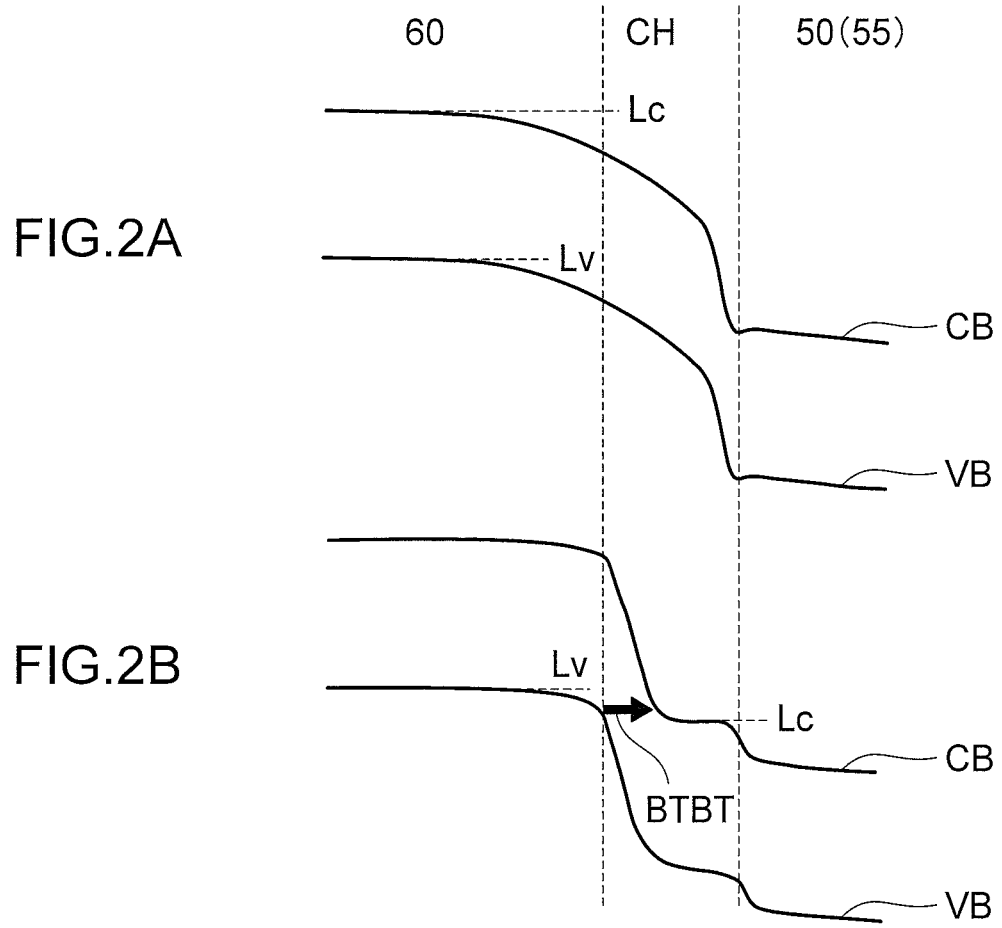
FIGS. 2A and 2B are energy band diagrams showing an example of an operation of the TFET 100 according to the first embodiment.

FIGS. 2A and 2B are energy band diagrams showing an example of an operation of the TFET 100 according to the first embodiment. FIG. 2A is an energy band diagram of a case where the TFET 100 is in an off-state and FIG. 2B is an energy band diagram of a case where the TFET 100 is in an on-state. FIGS. 2A and 2B are energy band diagrams at positions along a broken line A in FIG. 1. In this case, CB denotes the energy level of a conduction band and VB denotes the energy level of a valence band.

In the TFET 100 according to the first embodiment, voltages of the same polarity are applied to the gate electrode 40 and the drain layer 50 (the extension layer 55). It is assumed, for example, that 0 volt is applied to the source layer 60 and that a positive voltage (1 volt, for example) is applied to the drain layer 50 (the extension layer 55). That is, it is assumed that a reverse bias is applied to a junction between the source layer 60 and the drain layer 50 as shown in FIG. 2A. When the TFET 100 is to be turned on, a positive voltage is applied to the gate electrode 40.

When the gate electrode 40 is at a voltage lower than a threshold voltage, the TFET 100 is in an off-state. At that time, the energy level VB of the valence band of the source layer 60 and the energy level CB of the conduction band of the channel portion CH do not have substantially the same value and thus tunneling of electrons is forbidden. That is, while quite a small current (an off-leakage) due to the reverse bias flows at the junction between the source layer 60 and the drain layer 50, the TFET 100 can be regarded as in an off-state.

When a positive voltage with respect to a source voltage is applied to the gate electrode 40, the channel portion CH starts being depleted. At that time, the energy band of the channel portion CH is bent toward the valence band as shown in FIG. 2B. When an energy level Lv of the balance band of the source layer 60 becomes equal to an energy level Lc of the conduction band of the surface of the channel portion CH, band to band tunneling (hereinafter, also "BTBT") of electrons occurs from the source layer 60 to the channel portion CH. A voltage of the gate electrode 40 at a time when the BTBT occurs is referred to as a threshold voltage. The threshold voltage is a gate voltage indicating the on-state of the TFET.

When a voltage higher than the threshold voltage is applied to the gate electrode 40, a part of the channel portion CH in which the BTBT occurs extends from the side of the drain layer 50 to the side of the source layer 60. That is, a region, where the energy level Lc of the conduction band on the surface of the channel portion CH is equal to or lower than the energy level Lv of the valence band of the source layer 60, extends from the side of the drain layer 50 (the extension layer 55) to the side of the source layer 60.

Furthermore, when the voltage of the gate electrode 40 is further increased, the BTBT occurs in the whole of a region of the source layer 60 faced by the bottom surface of the gate electrode 40 (the whole channel portion CH). Accordingly, a current (Id) is increased by increasing the voltage of the gate electrode 40. Because the BTBT occurs in the region of the source layer 60 faced by the bottom surface of the gate electrode 40 (the channel portion CH) in the on-state, the TFET 100 can obtain a current depending on the area of the channel portion CH (the channel length×the channel width).

A drain facing region, where the drain layer 50 or the extension layer 55 faces the bottom surface of the gate electrode 40, is not included in the channel portion CH. However, when the drain facing region is fixed, the area of the channel portion CH can be adjusted by adjusting the area of the bottom surface of the gate electrode 40. Therefore, it can be said that the current value in the on-state depends on the area of the bottom surface of the gate electrode 40. When there is almost no drain facing region, the whole bottom surface of the gate electrode 40 faces the source layer 60. In this case, the area of the bottom surface of the gate electrode 40 is almost equal to the area of the channel portion CH.

As described above, in the TFET 100 according to the first embodiment, the source layer 60 extends in the semiconductor layer 20 from the other end E2 of the gate electrode 40 to near the end E1 of the gate electrode 40. Accordingly, most parts of the bottom surface of the gate electrode 40 face the source layer 60 and the source layer 60 is formed in the whole channel portion CH. That is, the channel portion CH is formed to have a substantially equal impurity concentration to that of the source layer 60. Therefore, impurity concentration profiles of the source layer 60 and the channel portion CH are substantially even and smooth. By setting an impurity concentration profile from the source layer 60 to the channel portion CH to be substantially even in this way, variations of the impurity concentration profile in the wafer plane can be also suppressed. Thus, variations in the electrical characteristics (the threshold voltage, for example) of the TFET 100 in the wafer plane are suppressed. And, threshold voltages of a plurality of the TFETs 100 included in a semiconductor integrated circuit can be formed in nearly designed values. As a result, the power supply voltage of the semiconductor integrated circuit can be lowered, therefore, the power consumption can be suppressed.

Figure 3:
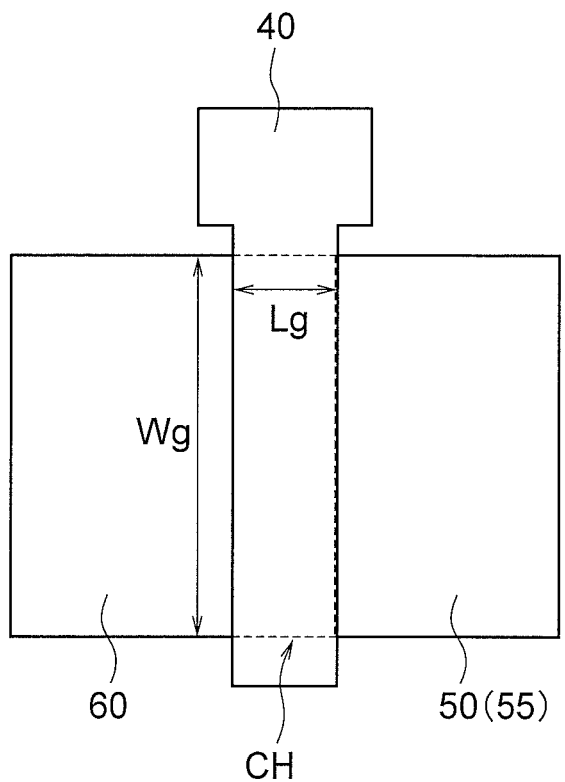
FIG. 3 is a plan view showing the gate electrode 40, the drain layer 50, and the source layer 60 of the TFET 100.
Figure 4:
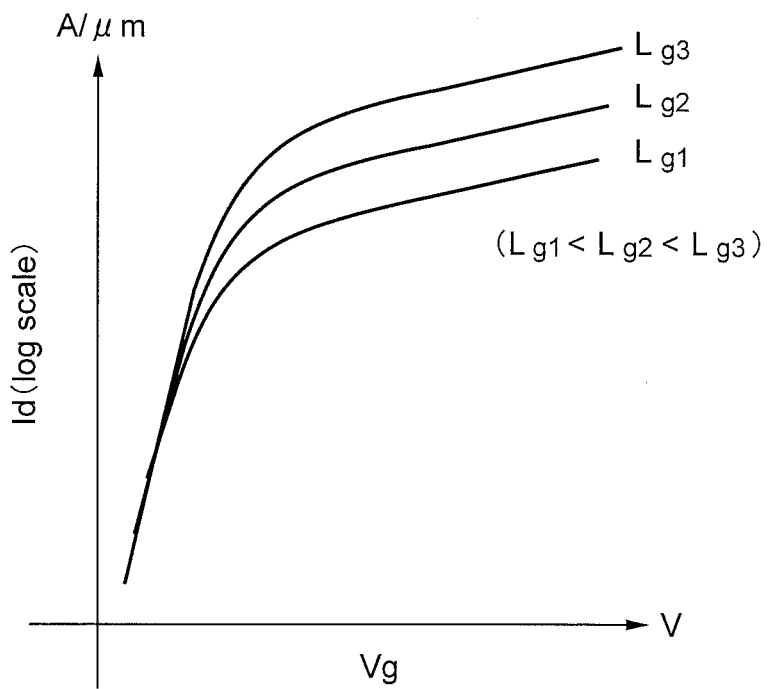
FIG. 4 is a graph showing relations between gate lengths Lg1 to Lg3 of the gate electrode 40 and the drain current Id (the on-state current)

In the TFET 100 according to the first embodiment, the area of the channel portion CH (the channel length×the channel width) can be adjusted by adjusting the area of the gate electrode 40 (the gate length×the gate width). For example, FIG. 3 is a plan view showing the gate electrode 40, the drain layer 50, and the source layer 60 of the TFET 100. As shown in FIG. 3, the area of the channel portion CH (an area where the gate electrode 40 and the source layer 60 face each other) can be adjusted by a gate length Lg and a gate width Wg of the gate electrode 40. Therefore, an on-state current can be controlled by adjusting a size (the gate length and/or the gate width) of the gate electrode 40. For example, FIG. 4 is a graph showing relations between gate lengths Lg1 to Lg3 of the gate electrode 40 and the drain current Id (the on-state current). In this case, Lg1<Lg2<Lg3. As shown in FIG. 4, when the gate length is increased from Lg1 to Lg3, the drain current Id in the on-state increases. When the drain current Id in the on-state changes, the SS characteristics also change. Therefore, according to the first embodiment, not only steep SS characteristics can be obtained, but also the TFET 100 having threshold voltages corresponding to various use applications can be formed by adjusting the size of the gate electrode 40.

FIGS. 5A to 8 are cross-sectional views showing an example of a manufacturing method of the TFET 100 according to the first embodiment.

The gate dielectric film 30 is first formed on the semiconductor layer 20 as shown in FIG. 5A. The semiconductor layer 20 can be an SOI layer of an SOI substrate, a silicon layer formed using a silicon substrate, or a semiconductor layer using a group III-V compound semiconductor substrate. The semiconductor layer 20 can be a semiconductor layer epitaxially grown on an arbitrary substrate. For example, the semiconductor layer 20 can be a SiGe layer epitaxially grown on an SOI substrate or a bulk substrate.

The gate dielectric film 30 can be a thermally-oxidized film obtained by thermally oxidizing the semiconductor layer 20. Alternatively, the gate dielectric film 30 can be a TEOS film, a silicon nitride film (such as $Si_3N_4$), SiON, or a high dielectric film formed by a CVD (Chemical Vapor Deposition) method.

The source layer 60 and the channel portion CH are then formed by ion implantation as shown in FIG. 5B. Ions to be implanted are, for example, p-type impurities such as B or $BF_2$. Activation annealing such as RTA (Rapid Thermal Annealing) is then performed. This forms the source layer 60 and the channel portion CH in substantially uniform impurity concentrations.

Figure 6A:
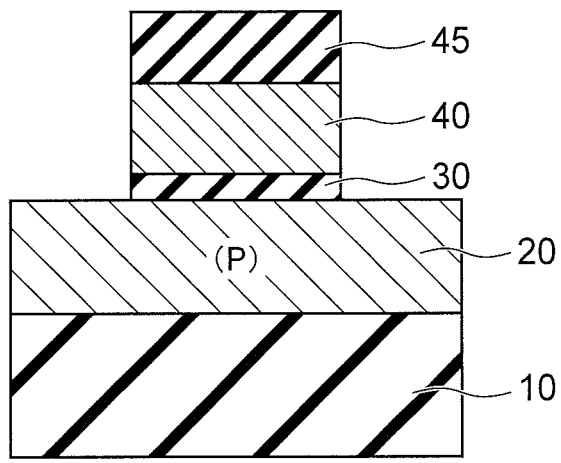

The material of the gate electrode 40 is then deposited on the gate dielectric film 30, and the material of a hard mask 45 is deposited on the material of the gate electrode 40. The material of the gate electrode 40 is formed using, for example, polycrystalline silicon doped with n-type impurities such as phosphorus or arsenic. The material of the hard mask 45 is formed using, for example, an insulating film such as a silicon nitride film. The material of the hard mask 45 is then processed into a layout pattern of the gate electrode 40 using a lithographic technique and an RIE (Reactive Ion Etching) method. The gate electrode 40 and the gate dielectric film 30 are processed by the RIE method using the hard mask 45 as a mask. In this way, a structure shown in FIG. 6A is obtained. A combination of the gate electrode 40 and the gate dielectric film 30 may be a combination of polysilicon and SiON or a combination of a metal gate and a high dielectric film. When the combination of the gate electrode 40 and the gate dielectric film 30 is a combination of a metal gate and a high dielectric film, the material of the metal gate may be TiN, TaOx, or the like and the material of the high dielectric film may be $HfOx$, HfON, HfSiON, $Al_2O_3$, or the like. In this case, x is a positive number. The shape of the gate electrode 40 may have a Fin-gate or multilayered-gate structure.

Figure 6B:
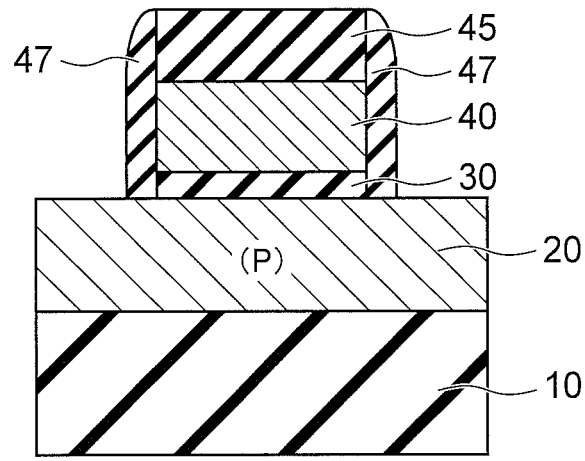

An insulating film such as TEOS is then deposited on side surfaces of the gate electrode 40 and an upper surface of the hard mask 45 using the CVD method. The insulating film is then anisotropically etched using the RIE method to leave the spacer 47 on the side surfaces of the gate electrode 40 as shown in FIG. 6B.

Figure 7A:
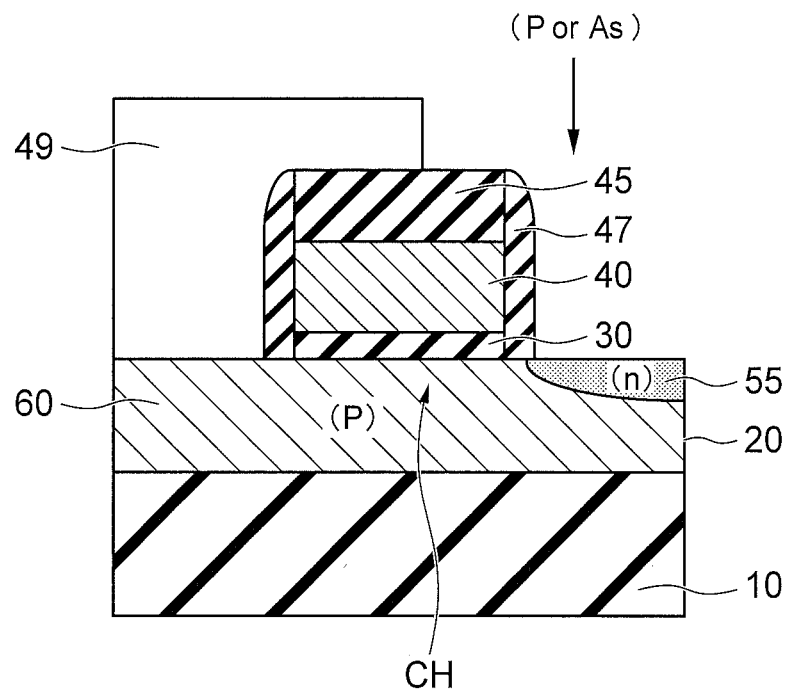

The source layer 60 is then covered with a photoresist 49 using the lithographic technique as shown in FIG. 7A. Ions of n-type impurities (phosphorus or arsenic, for example) are implanted in a part of the semiconductor layer 20 on the drain side using the photoresist 49 as a mask. At that time, implantation of the n-type impurities changes the part of the semiconductor layer 20 on the drain side from the p type to the n type. The n-type impurities are controlled to be locally implanted to shallow positions in the semiconductor layer 20. The extension layer 55 is formed in this way.

Figure 7B:
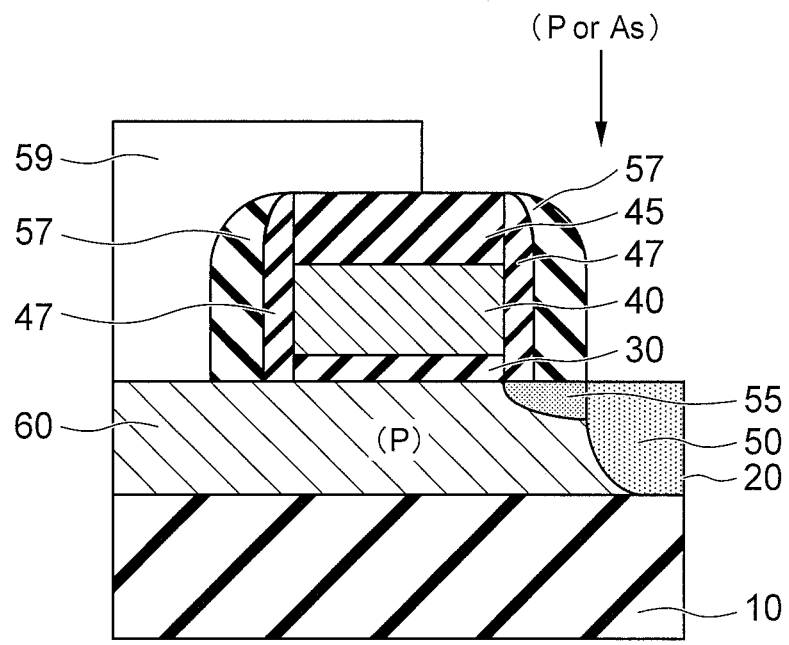
Figure 8:
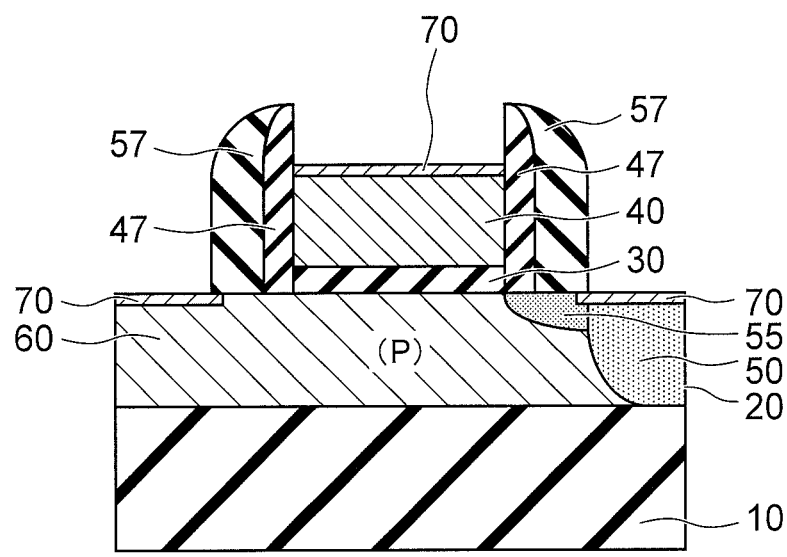

After the photoresist 49 is removed, an insulating film such as TEOS is further deposited on the spacer 47 and the hard mask 45 using the CVD method. The insulating film is then anisotropically etched using the RIE method to cause the side wall film 57 to further remain on side surfaces of the spacer 47 as shown in FIG. 7B. In this way, the spacer 47 and the side wall film 57 are formed on the side surfaces of the gate electrode 40.

The source layer 60 is then covered with a photoresist 59 using the lithographic technique. Ions of n-type impurities (phosphorus or arsenic, for example) are implanted in a part of the semiconductor layer 20 on the drain side using the photoresist 59 as a mask. In the embodiment, the n-type impurities are controlled to be implanted to deeper positions than at the time of formation of the extension layer 55. Activation annealing is then performed using the RTA method or the like. In this way, the drain layer 50 and the extension layer 55 are formed.

After the photoresist 59 is removed, the hard mask 45 is removed using wet etching. Metal such as Ni, Co, or Ti is then deposited on the gate electrode 40, the source layer 60, and the drain layer 50 (or the extension layer 55) using a PVD (Physical Vapor Deposition) method. By reacting the metal layer with silicon, the silicide layer 70 is formed on the gate electrode 40, the source layer 60, and the drain layer 50 (or the extension layer 55).

The interlayer dielectric film 90, contacts (not shown), metal interconnections (not shown), and the like are then formed to complete the TFET 100 shown in FIG. 1. While the n-TFET is explained in the first embodiment, a p-TFET can be easily formed by changing the conductivity type of the impurities. The p-TFET is in an on-state when a gate voltage with reference to a source voltage is lower than a threshold voltage and is in an off-state when the gate voltage is higher than the threshold voltage. For example, in the case of a p-TFET in a CMOS inverter, a positive voltage is applied to a source. Therefore, the p-TFET is turned on by setting a gate voltage at 0 volt, while the p-TFET is turned off by setting the gate voltage at a power supply voltage (1 volt, for example). The effect of the first embodiment is not lost also in the p-TFET.

In the first embodiment, the source layer 60 and a diffusion layer of the channel portion CH are simultaneously formed and have substantially uniform impurity concentrations as shown in FIG. 5B. Therefore, according to the first embodiment, the impurity concentration profile from the source layer 60 to the channel portion CH can be set substantially even, which prevents formation of a junction between the source layer 60 and the channel portion CH. Accordingly, as described above, variations in the electrical characteristics of the TFET 100 in the wafer plane are suppressed. Therefore, the threshold voltages of the TFETs 100 included in a semiconductor integrated circuit can be formed in nearly designed values. This enables to reduce the power supply voltage, resulting in reduction of the power consumption.

Second Embodiment

Figure 9:
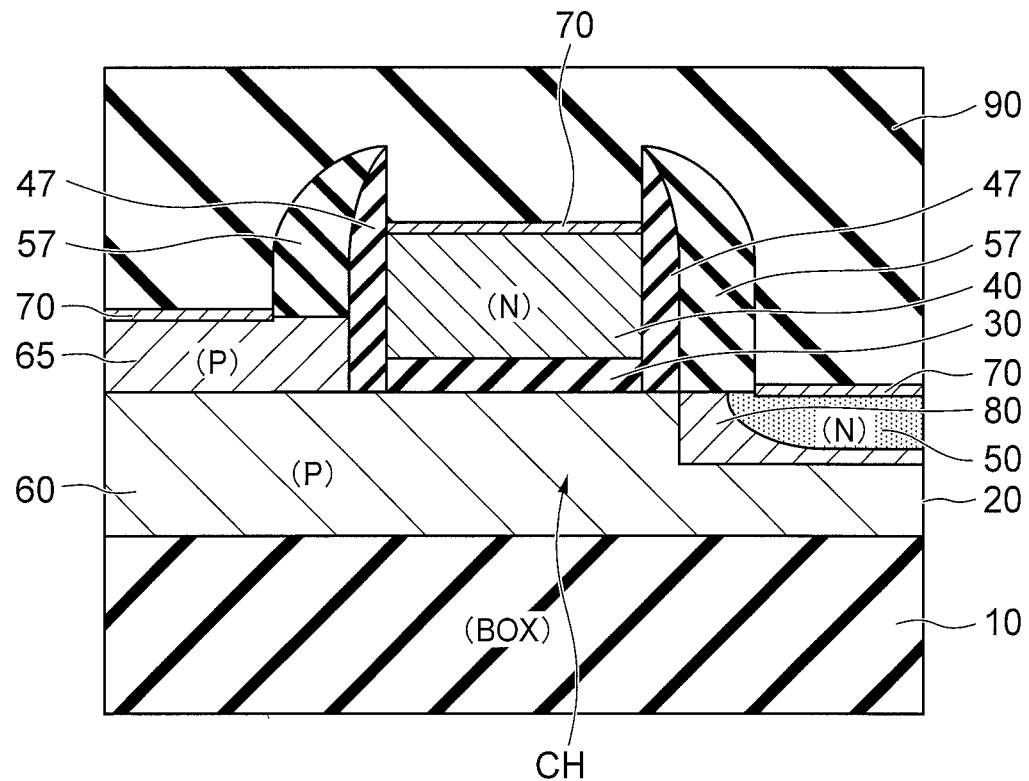
FIG. 9 is a cross-sectional view showing an example of a configuration of a TFET 200 according to a second embodiment.

FIG. 9 is a cross-sectional view showing an example of a configuration of a TFET 200 according to a second embodiment. In the TFET 200 according to the second embodiment, a low concentration layer 80 is provided between the drain layer 50 and the source layer 60. The low concentration layer 80 is formed using, for example, a silicon crystal layer epitaxially grown. The low concentration layer 80 is a semiconductor layer of an impurity concentration lower than those of the source layer 60, the drain layer 50, and the channel portion CH. The low concentration layer 80 is formed, for example, by forming a silicon layer not doped with impurities. Furthermore, the TFET 200 does not have the extension layer 55. Therefore, the drain layer 50 is distanced from just underneath of the gate electrode 40, and the source layer 60 is adjacent to the low concentration layer 80 in a region of the semiconductor layer 20 on the side of one end of the gate electrode 40. That is, the drain layer 50 is offset from the channel portion CH.

The TFET 200 has a p-diffusion layer 65 on the source layer 60. The diffusion layer 65 is a silicon crystal layer epitaxially grown at the same time as the low concentration layer 80. The diffusion layer 65 includes p-type impurities as the source layer 60 and functions as a part of the source layer 60. Therefore, the source layer 60 and the diffusion layer 65 are also collectively referred to as the source layers 60 and 65. Characteristics of the TFET 200 are not influenced even when the diffusion layer 65 is not provided. Other configurations of the second embodiment may be similar to corresponding configurations of the first embodiment.

According to the second embodiment, impurity concentration profiles of the source layer 60 and the channel portion CH are substantially even and smooth. Also in the TFET 200 according to the second embodiment, the area of the channel portion CH (the channel length×the channel width) can be adjusted by adjusting the area of the gate electrode 40 (the gate length×the gate width). Therefore, the second embodiment can achieve effects identical to those of the first embodiment.

Furthermore, the low concentration layer 80 is inserted between the source layer 60 (the channel portion CH) and the drain layer 50. Therefore, according to the second embodiment, a junction leakage (an off-leakage) and a GIDL current can be further reduced. Accordingly, the second embodiment can further reduce the power consumption.

FIGS. 10A to 11B are cross-sectional views showing an example of a manufacturing method of the TFET 200 according to the second embodiment.

Figure 10A:
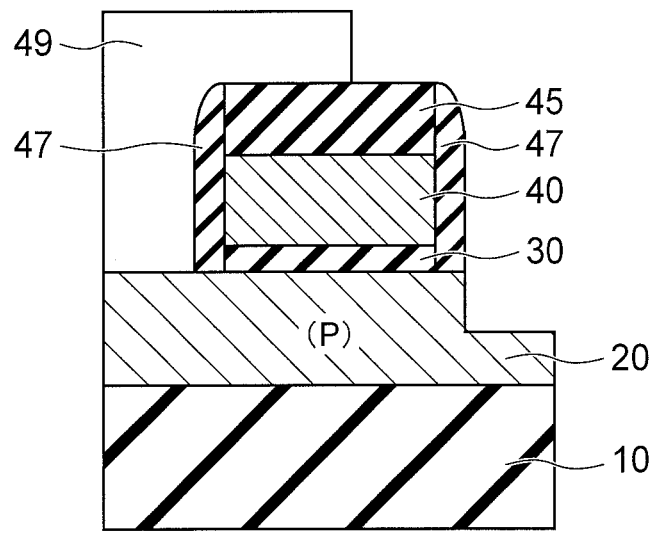
FIGS. 10A to 11B are cross-sectional views showing an example of a manufacturing method of the TFET 200 according to the second embodiment.

After the steps shown in FIGS. 5A to 6B have been performed, the source layer 60 is covered with the photoresist 49 using the lithographic technique as shown in FIG. 10A. A part of the semiconductor layer 20 on the drain side is etched from the surface to a depth not reaching the bottom surface by the RIE method using the photoresist 49 as a mask.

Figure 10B:
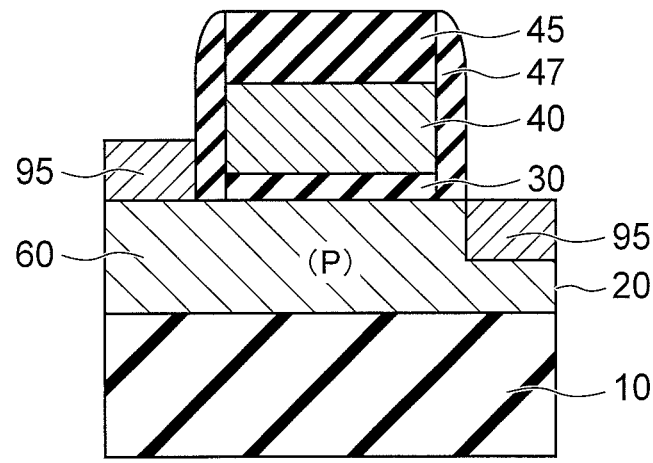

After the photoresist 49 is removed, non-doped silicon is selectively and epitaxially grown on a drain region and a source region. In this way, a monocrystalline layer 95 is formed on the drain region and the source region as shown in FIG. 10B. The upper surface and the side surfaces of the gate electrode 40 are covered with the hard mask 45 and the spacer 47. Accordingly, the monocrystalline layer 95 is not in contact with the gate electrode 40. The monocrystalline layer 95 formed on the drain region becomes the low concentration layer 80 after subsequent steps. The monocrystalline layer 95 on the source layer 60 becomes the diffusion layer 65 after subsequent steps.

A hard mask using an insulating film can be used instead of the photoresist 49. In this case, when the monocrystalline layer 95 is to be epitaxially grown, the hard mask is kept remained. Accordingly, the monocrystalline layer 95 can be formed on the drain region without formed on the source layer 60. That is, the monocrystalline layer 95 can be selectively grown on the drain region.

Figure 11A:
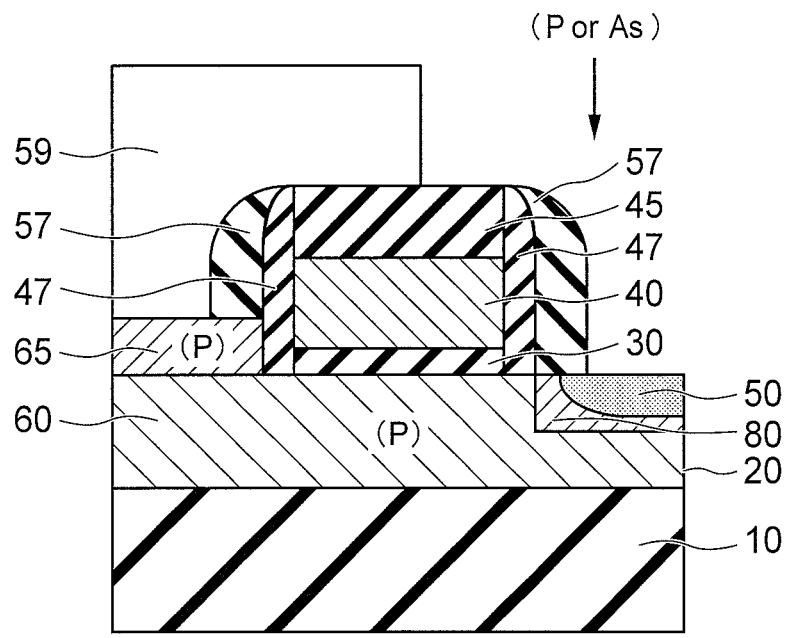

An insulating film such as a TEOS is then deposited on the spacer 47 and the hard mask 45 using the CVD method. The insulating film is then anisotropically etched using the RIE method. Thereby, the side wall film 57 is left on side surfaces of the spacer 47 as shown in FIG. 11A. In this way, the spacer 47 and the side wall film 57 are formed on the side surfaces of the gate electrode 40.

The source layer 60 is then covered with the photoresist 59 using the lithographic technique. Ions of n-type impurities (phosphorus or arsenic, for example) are implanted in a part of the semiconductor layer 20 on the drain side using the photoresist 59 as a mask. Activation annealing is then performed using the RTA method, or the like. In this way, the drain layer 50 is formed and the monocrystalline layer 95 on the drain and source regions become the low concentration layer 80 and the diffusion layer 65, respectively, as shown in FIG. 11A. For example, phosphorus or arsenic is introduced into the drain layer 50. Boron is introduced into the source layer 60. Boron diffuses more easily than phosphorus or arsenic, and thus the diffusion layer 65 can have an impurity concentration almost similar to that of the source layer 60 because of annealing. On the other hand, the low concentration layer 80 is subject to diffusion of the n-type impurities from the high-concentration drain layer 50 and is subject to diffusion of the p-type impurities from the source layer 60. Therefore, in the low concentration layer 80, a pn junction is formed in a low-concentration n-semiconductor layer or a low-concentration p-semiconductor layer due to the annealing. Alternatively, the low concentration layer 80 includes an intrinsic semiconductor layer.

Figure 11B:
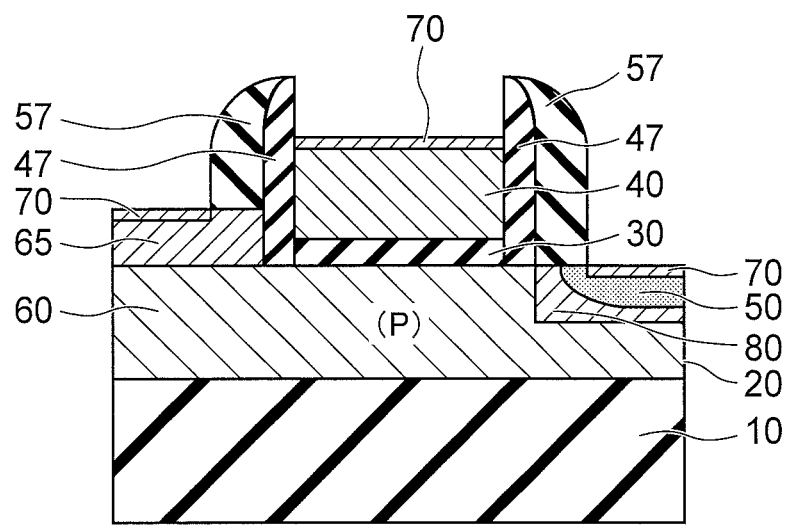

After the photoresist 59 is removed, the hard mask 45 is removed using wet etching. Metal such as Ni, Co, or Ti is then deposited on the gate electrode 40, the diffusion layer 65 (or the source layer 60), and the drain layer 50 using the PVD method. By reacting the metal with silicon, the silicide layer 70 is formed on the gate electrode 40, the diffusion layer 65 (or the source layer 60), and the drain layer 50 as shown in FIG. 11B.

The interlayer dielectric film 90, contacts (not shown), metal interconnections (not shown), and the like are then formed to complete the TFET 200 shown in FIG. 9. While the n-TFET is explained in the second embodiment, a p-TFET can be easily formed by changing the conductivity type of the impurities.

As described above, in the second embodiment, the low concentration layer 80 (an intrinsic semiconductor layer, for example) can be formed between the source layer 60 (the channel portion CH) and the drain layer 50. Therefore, the junction leakage (the off-leakage) can be further reduced according to the second embodiment.

Third Embodiment

Figure 12:
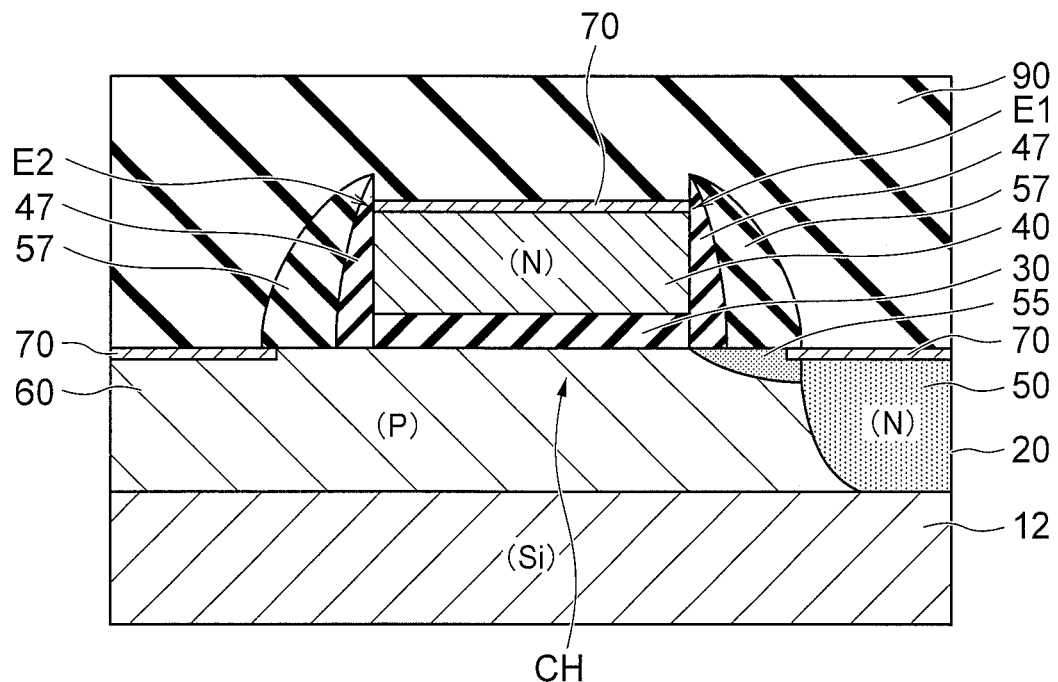
FIG. 12 is a cross-sectional view showing an example of a configuration of a TFET 300 according to a third embodiment.

FIG. 12 is a cross-sectional view showing an example of a configuration of a TFET 300 according to a third embodiment. The TFET 300 according to the third embodiment is formed on a bulk semiconductor substrate 12. In the third embodiment, the semiconductor layer 20 is formed on the surface of the bulk semiconductor substrate 12. The bulk semiconductor substrate 12 can be, for example, a bulk silicon substrate or a bulk SiGe substrate. The semiconductor layer 20 can be either a silicon layer or a SiGe layer formed on a bulk silicon substrate, or a silicon layer or a SiGe layer formed on a bulk SiGe substrate. Other configurations of the third embodiment may be similar to corresponding configurations of the first embodiment. Therefore, the third embodiment can achieve effects identical to those of the first embodiment.

A manufacturing method of the TFET 300 having a SiGe layer formed on a bulk silicon substrate as the semiconductor layer 20 is explained below.

Figure 13A:
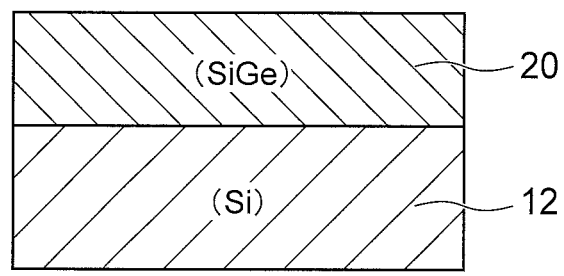
FIGS. 13A and 13B are cross-sectional views showing an example of a manufacturing method of the TFET 300 according to the third embodiment.
Figure 13B:
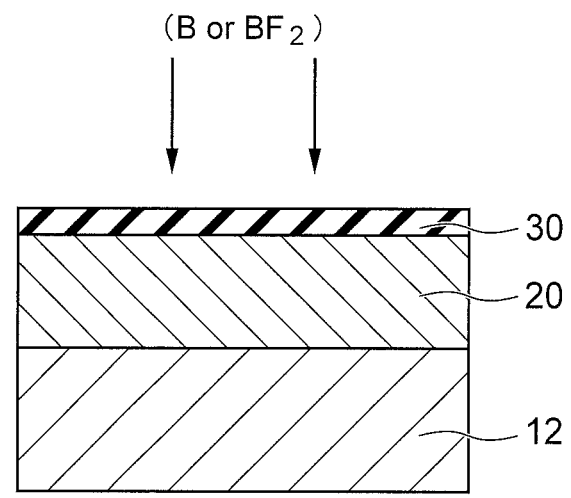

FIGS. 13A and 13B are cross-sectional views showing an example of a manufacturing method of the TFET 300 according to the third embodiment. For example, a $Si_{1-x}Ge_x$ layer 20 is epitaxially grown on the bulk silicon substrate 12 as shown in FIG. 13A. In this case, x is a positive number. $Si_{1-x}Ge_x$ is a material in which BTBT occurs more easily than in silicon.

The gate dielectric film 30 is then formed on the $Si_{1-x}Ge_x$ layer 20. Then, the source layer 60 and the channel portion CH are formed by ion implantation as shown in FIG. 13B.

Thereafter, the steps shown in FIGS. 6A to 8 are performed to complete the TFET 300. According to the third embodiment, because the bulk semiconductor substrate is used, the TFET 300 can be easily mounted with a conventional CMOS. In addition, the third embodiment can achieve effects identical to those of the first embodiment.

Needless to mention, the third embodiment can be combined with the second embodiment. That is, the TFET 200 according to the second embodiment can be formed on the bulk semiconductor substrate 12 according to the third embodiment. Therefore, the third embodiment can achieve effects identical to those of the second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a semiconductor layer;
a gate dielectric film provided on a surface of the semiconductor layer;
a gate electrode provided on the semiconductor layer via the gate dielectric film;
a drain layer of a first conductivity type provided in a part of the semiconductor layer on a side of a first end of the gate electrode; and
a source layer of a second conductivity type provided in a part of the semiconductor layer on a side of a second end of the gate electrode and below the gate electrode, the source layer having a substantially uniform impurity concentration at the part of the semiconductor layer below the gate electrode,
wherein voltages of a same polarity are applied to the gate electrode and the drain layer.

2. The device of claim 1, wherein an impurity concentration of a channel portion below the gate electrode is substantially equal to that of the source layer.

3. The device of claim 1, wherein the source layer extends at least to a region of the semiconductor layer near the side of the first end of the gate electrode and below the gate electrode.

4. The device of claim 1, wherein the source layer joins the drain layer in a region of the semiconductor layer on the side of the first end of the gate electrode.

5. The device of claim 1, wherein the source layer joins a low concentration layer having an impurity concentration lower than those of the source layer and the drain layer in the region of the semiconductor layer on the side of the first end of the gate electrode.

6. The device of claim 1, wherein a reverse bias voltage is applied between the source layer and the drain layer.

7. The device of claim 1, wherein the semiconductor layer is an SOI layer.

8. The device of claim 1, wherein the semiconductor layer is a surface layer of a bulk semiconductor substrate.

9. The device of claim 8, wherein:
the bulk semiconductor substrate is a silicon substrate, and
the semiconductor layer is formed using SiGe.

10. A semiconductor device comprising:
a semiconductor layer;
a gate dielectric film provided on a surface of the semiconductor layer;
a gate electrode provided on the gate dielectric film;
a drain layer of a first conductivity type provided in a part of the semiconductor layer on a side of a first end of the gate electrode;
an extension layer of the first conductivity type provided on a surface of the semiconductor layer so as to extend from the drain layer to a part of the semiconductor layer below the gate electrode; and
a source layer of a second conductivity type provided in a part of the semiconductor layer on a side of a second end of the gate electrode and below the gate electrode,
wherein the source layer is provided from the side of the second end of the gate electrode to the part of the semiconductor layer below the gate electrode so as to join the extension layer near the first end of the gate electrode.

11. The device of claim 10, wherein an impurity concentration of a channel portion below the gate electrode is substantially equal to that of the source layer.

12. The device of claim 10, wherein the source layer extends at least to a region of the semiconductor layer near the side of the first end of the gate electrode and below the gate electrode.

13. The device of claim 10, wherein a reverse bias voltage is applied between the source layer and the drain layer.

14. The device of claim 10, wherein the semiconductor layer is an SOI layer.

15. The device of claim 10, wherein the semiconductor layer is a surface layer of a bulk semiconductor substrate.

16. The device of claim 15, wherein:
the bulk semiconductor substrate is a silicon substrate, and
the semiconductor layer is formed using SiGe.

17. A semiconductor device comprising:
a semiconductor layer;
a gate dielectric film provided on a surface of the semiconductor layer;
a gate electrode provided on the semiconductor layer via the gate dielectric film;
a drain layer of a first conductivity type provided in a part of the semiconductor layer on a side of a first end of the gate electrode;
a source layer of a second conductivity type provided in a part of the semiconductor layer on a side of a second end of the gate electrode and below the gate electrode; and
a low concentration layer provided in a part of the semiconductor layer between the source layer and the drain layer, the low concentration layer having an impurity concentration lower than those of the source layer and the drain layer,
wherein the source layer is provided from the side of the second end of the gate electrode to the part of the semiconductor layer below the gate electrode so as to join the low concentration layer near the first end of the gate electrode.

18. The device of claim 17, wherein an impurity concentration of a channel portion below the gate electrode is substantially equal to that of the source layer.

19. The device of claim 17, wherein the source layer extends at least to a region of the semiconductor layer near the side of the first end of the gate electrode and below the gate electrode.

20. The device of claim 17, wherein a reverse bias voltage is applied between the source layer and the drain layer.

* * * * *